US012742830B2

(12) United States Patent
Kim

(10) Patent No.: US 12,742,830 B2
(45) Date of Patent: Sep. 22, 2026

(54) BATTERY DIAGNOSIS APPARATUS AND METHOD

(71) Applicant: LG ENERGY SOLUTION, LTD., Seoul (KR)

(72) Inventor: Jeong Wan Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 529 days.

(21) Appl. No.: 18/029,488

(22) PCT Filed: Oct. 12, 2021

(86) PCT No.: PCT/KR2021/014043
§ 371 (c)(1),
(2) Date: Mar. 30, 2023

(87) PCT Pub. No.: WO2022/092621
PCT Pub. Date: May 5, 2022

(65) Prior Publication Data

US 2024/0012065 A1 Jan. 11, 2024

(30) Foreign Application Priority Data

Oct. 30, 2020 (KR) ........................ 10-2020-0143820

(51) Int. Cl.
*G01R 31/392* (2019.01)
*G01R 31/389* (2019.01)

(52) U.S. Cl.
CPC ......... *G01R 31/392* (2019.01); *G01R 31/389* (2019.01)

(58) Field of Classification Search
CPC .. G01R 31/392; G01R 31/389; G01R 31/367; G01R 31/396; Y02E 60/10
See application file for complete search history.

(56) References Cited

U.S. PATENT DOCUMENTS 9,419,289 B2 8/2016 Sholklapper et al.
2013/0076363 A1 3/2013 Takahashi et al.
(Continued)

FOREIGN PATENT DOCUMENTS

CA 3 136 621 A1 10/2020
CN 103278695 A 9/2013
(Continued)

OTHER PUBLICATIONS

Extended European Search Report for European Application No. 21886615.0, dated Feb. 8, 2024.
(Continued)

*Primary Examiner* — Lal Ce Mang
(74) *Attorney, Agent, or Firm* — Birch, Stewart, Kolasch & Birch, LLP

(57) ABSTRACT

There is provided a battery diagnosis apparatus including a calculating unit for calculating degrees of aging of a battery cell and a battery module including the battery cell, a measuring unit for measuring an alternating current (AC) impedance of a battery pack including the battery module, an estimating unit for estimating a state of health (SOH) of the battery pack based on the AC impedance of the battery pack, and a diagnosing unit for diagnosing a state of the battery pack, based on the degree of aging of the battery cell, the degree of aging of the battery module, and the SOH of the battery pack.

17 Claims, 8 Drawing Sheets

(56) References Cited

U.S. PATENT DOCUMENTS

| | | | | |
|---|---|---|---|---|
| 2013/0090872 | A1 | 4/2013 | Kurimoto | |
| 2014/0009123 | A1* | 1/2014 | Park | G01R 31/392 320/152 |
| 2014/0015537 | A1 | 1/2014 | Uchida et al. | |
| 2015/0093611 | A1 | 4/2015 | Obata | |
| 2015/0147603 | A1* | 5/2015 | Jung | B60L 58/12 429/61 |
| 2016/0033582 | A1 | 2/2016 | You et al. | |
| 2017/0219660 | A1 | 8/2017 | Christensen et al. | |
| 2019/0271747 | A1* | 9/2019 | Osaka | G01R 31/367 |
| 2019/0288520 | A1 | 9/2019 | Abdel-Monem et al. | |
| 2020/0386820 | A1 | 12/2020 | Harper et al. | |
| 2021/0148985 | A1 | 5/2021 | Yoon | |
| 2021/0339653 | A1 | 11/2021 | Yamamoto et al. | |
| 2022/0149451 | A1* | 5/2022 | Burchardt | B60L 50/64 |

FOREIGN PATENT DOCUMENTS

| | | | | |
|---|---|---|---|---|
| CN | 104597407 | A | 5/2015 | |
| CN | 104833921 | A | 8/2015 | |
| CN | 110441705 | A | 11/2019 | |
| EP | 3 671 244 | A1 | 6/2020 | |
| JP | 5341823 | B2 | 11/2013 | |
| JP | 2014-20818 | A | 2/2014 | |
| JP | 5553177 | B2 | 7/2014 | |
| JP | 5733275 | B2 | 6/2015 | |
| JP | 6102609 | B2 | 3/2017 | |
| JP | 2018-179652 | A | 11/2018 | |
| JP | 2020-113507 | A | 7/2020 | |
| KR | 20100085791 | A * | 7/2010 | G01R 19/175 |
| KR | 10-1160545 | B1 | 6/2012 | |
| KR | 10-2015-0139349 | A | 12/2015 | |
| KR | 10-2016-0014940 | A | 2/2016 | |
| KR | 10-2016-0058281 | A | 5/2016 | |
| KR | 10-2019-0090993 | A | 8/2019 | |
| KR | 10-2020-0017367 | A | 2/2020 | |
| KR | 10-2020-0038005 | A | 4/2020 | |
| KR | 10-2103089 | B1 | 4/2020 | |
| KR | 10-2125462 | B1 | 6/2020 | |

OTHER PUBLICATIONS

International Search Report for PCT/KR2021/014043 (PCT/ISA/210) mailed on Jan. 24, 2022.

* cited by examiner

BATTERY DIAGNOSIS APPARATUS AND METHOD

CROSS-REFERENCE TO RELATED APPLICATION

This application claims priority to and the benefit of Korean Patent Application No. 10-2020-0143820 filed in the Korean Intellectual Property Office on Oct. 30, 2020, the entire contents of which are incorporated herein by reference.

TECHNICAL FIELD

The present disclosure relates to a battery diagnosis apparatus and method, and more particularly, to a battery diagnosis apparatus and method in which a state of a battery is diagnosed by using a degree of aging of the battery and a state of health (SOH) estimated through alternating current (AC) measurement.

BACKGROUND ART

Recently, research and development of secondary batteries have been actively performed. Herein, the secondary batteries, which are chargeable/dischargeable batteries, may include all of conventional nickel (Ni)/cadmium (Cd) batteries, Ni/metal hydride (MH) batteries, etc., and recent lithium-ion batteries. Among the secondary batteries, a lithium-ion battery has a much higher energy density than those of the conventional Ni/Cd batteries, Ni/MH batteries, etc. Moreover, the lithium-ion battery may be manufactured to be small and lightweight, such that the lithium-ion battery has been used as a power source of mobile devices. In addition, the lithium-ion battery is attracting attention as a next-generation energy storage medium as a usage range thereof is expanded to a power source of electric vehicles.

Furthermore, the secondary battery is generally used as a battery pack including a battery module where a plurality of battery cells are connected to one another in series and/or in parallel. The battery pack may be managed and controlled by a battery management system in terms of a state and an operation.

As representative devices using these battery cells, there may be an electric vehicle (EV) and an energy storage system (ESS). In particular, a battery for an EV is often discarded because of failing to satisfy an output condition of the EV, in spite of a lot of life left.

Consequently, ways to reuse these batteries with new applications rather than disposing the batteries have been attempted. For example, such battery reusage applications may include an ESS grid, uninterruptible power supply (UPS), a scooter, etc., and it is necessary to classify a class of a battery suitable for each application and apply the same. However, an existing method used to classify the battery calculates a SOHE by performing charging and discharging three times or more, consuming a long operation time and being procedurally cumbersome.

DISCLOSURE

Technical Problem

The present disclosure aims to provide a battery diagnosis apparatus and method in which a degree of aging of a battery is calculated and a state of health (SOH) of the battery is estimated through an alternating current (AC) impedance to classify a class of the battery within a short time, thereby quickly and easily diagnosing the state of the battery.

Technical Solution

A battery diagnosis apparatus according to an embodiment of the present disclosure includes a calculating unit configured to calculate degrees of aging of a battery cell and a battery module including the battery cell, a measuring unit configured to measure an alternating current (AC) impedance of a battery pack including the battery module, an estimating unit configured to estimate a state of health (SOH) of the battery pack based on the AC impedance of the battery pack, and a diagnosing unit configured to diagnose a state of the battery pack, based on the degree of aging of the battery cell, the degree of aging of the battery module, and the SOH of the battery pack.

The diagnosing unit of the battery diagnosis apparatus according to an embodiment of the present disclosure may determine whether the battery pack is reusable, based on the degree of aging of the battery cell, the degree of aging of the battery module, and the SOH of the battery pack.

The diagnosing unit of the battery diagnosis apparatus according to an embodiment of the present disclosure may diagnose a state of the battery pack based on a deviation of at least one of the degree of aging of the battery cell and the degree of aging of the battery module.

The diagnosing unit of the battery diagnosis apparatus according to an embodiment of the present disclosure may determine that the battery pack is reusable, when the deviation of at least one of the degree of aging of the battery cell and the degree of aging of the battery module falls within the reference range.

The calculating unit of the battery diagnosis apparatus according to an embodiment of the present disclosure may calculate the degree of aging of the battery module, the measuring unit may measure an AC impedance of the battery module, the estimating unit may estimate the SOH of the battery module based on the AC impedance of the battery module, and the diagnosing unit may diagnose the state of the battery module based on the degree of aging of the battery cell and the SOH of the battery module.

The diagnosing unit of the battery diagnosis apparatus according to an embodiment of the present disclosure may determine whether the battery module is reusable, based on the degree of aging of the battery cell and the SOH of the battery module.

The diagnosing unit of the battery diagnosis apparatus according to an embodiment of the present disclosure may determine that the battery module is reusable, when a deviation of on the degree of aging of the battery cell falls within the reference range.

According to an embodiment of the present disclosure, the battery module may include a plurality of battery cells and the diagnosing unit of the battery diagnosis apparatus may determine that the battery module is usable based on a battery cell having a highest degree of aging among the battery cells, when the deviation of the degree of aging of the battery cell falls beyond the reference range.

A battery diagnosis apparatus according to an embodiment of the present disclosure may include a calculating unit configured to calculate a degree of aging of a battery cell, a measuring unit configured to measure an alternating current (AC) impedance of a battery module including the battery cell, an estimating unit configured to estimate a state of health (SOH) of the battery module based on the AC impedance of the battery module, and a diagnosing unit configured to diagnose a state of the battery pack, based on the degree of aging of the battery cell and the SOH of the battery module.

The diagnosing unit of the battery diagnosis apparatus according to an embodiment of the present disclosure may determine whether the battery module is reusable, based on the degree of aging of the battery cell and the SOH of the battery module.

The diagnosing unit of the battery diagnosis apparatus according to an embodiment of the present disclosure may determine that the battery module is reusable, when a deviation of on the degree of aging of the battery cell falls within the reference range.

According to an embodiment of the present disclosure, the battery module may include a plurality of battery cells and the diagnosing unit of the battery diagnosis apparatus according to an embodiment of the present disclosure may determine that the battery module is usable based on a battery cell having a highest degree of aging among the battery cells, when the deviation of the degree of aging of the battery cell falls beyond the reference range.

The calculating unit of the battery diagnosis apparatus according to an embodiment of the present disclosure may calculate the degree of aging of the battery module, the measuring unit may measure an alternating current (AC) impedance of a battery pack including the battery module, the estimating unit may estimate the SOH of the battery pack based on the AC impedance of the battery pack, and the diagnosing unit may diagnose the state of the battery pack based on the degree of aging of the battery cell, the degree of aging of the battery module, and the SOH of the battery pack.

The diagnosing unit of the battery diagnosis apparatus according to an embodiment of the present disclosure may determine whether the battery pack is reusable, based on the degree of aging of the battery cell, the degree of aging of the battery module, and the SOH of the battery pack.

The diagnosing unit of the battery diagnosis apparatus according to an embodiment of the present disclosure may diagnose whether the battery pack is reusable based on a deviation of at least one of the degree of aging of the battery cell and the degree of aging of the battery module.

The diagnosing unit of the battery diagnosis apparatus according to an embodiment of the present disclosure may determine that the battery pack is reusable, when the deviation of at least one of the degree of aging of the battery cell and the degree of aging of the battery module falls within the reference range.

A battery diagnosis method according to an embodiment of the present disclosure includes calculating degrees of aging of a battery cell and a battery module including the battery cell, measuring an alternating current (AC) impedance of a battery pack including the battery module, estimating a state of health (SOH) of the battery pack based on the AC impedance of the battery pack, and diagnosing a state of the battery pack, based on the degree of aging of the battery cell, the degree of aging of the battery module, and the SOH of the battery pack.

A battery diagnosis method according to an embodiment of the present disclosure may further include measuring an AC impedance of the battery module, estimating an SOH of the battery module based on the AC impedance of the battery module, and diagnosing the state of the battery pack further based on the SOH of the battery module.

Advantageous Effects

With a battery diagnosis apparatus and method according to the present disclosure, by calculating a degree of aging of a battery and estimating a state of health (SOH) of the battery through an alternating current (AC) impedance, a class of the battery may be classified within a short time, thereby quickly and easily diagnosing a state of the battery.

MODE FOR INVENTION

Figure 1:
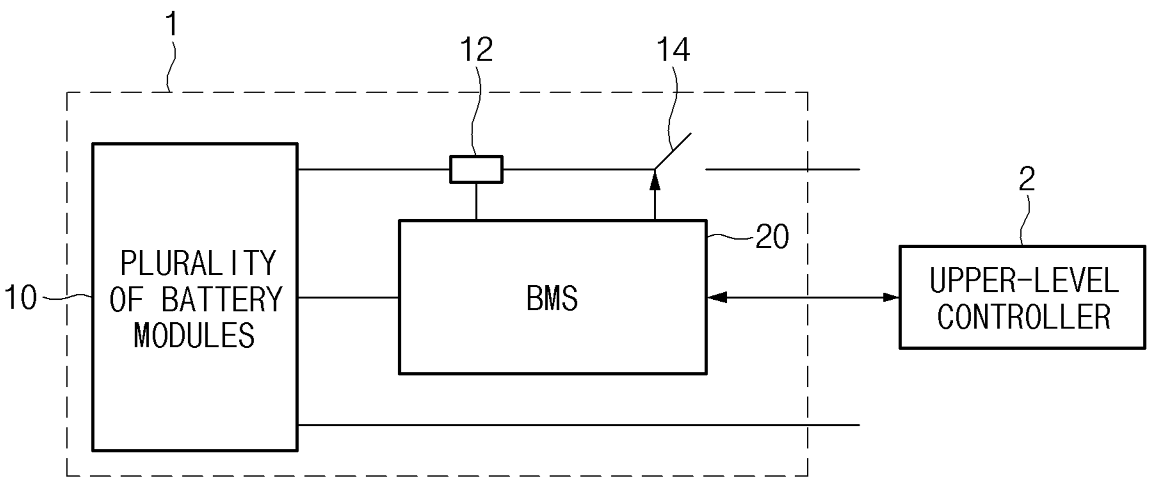
FIG. 1 is a block diagram showing a structure of a general battery pack.

Hereinafter, various embodiments of the present disclosure will be described in detail with reference to the accompanying drawings. In this document, identical reference numerals will be used for identical components in the drawings, and the identical components will not be redundantly described.

For various embodiments of the present disclosure disclosed herein, specific structural or functional descriptions are only exemplified for the purpose of describing the embodiments of the present disclosure, and various embodiments of the present disclosure disclosed herein may be implemented in various forms, and should not be construed as being limited to the embodiments described herein.

As used in various embodiments, the terms "1$^{st}$", "2$^{nd}$", "first", "second", or the like may modify various components regardless of importance, and do not limit the components. For example, a first component may be named as a second component without departing from the right scope of the present disclosure, and similarly, the second component may be named as the first component.

Terms used herein are used for only describing a specific exemplary embodiment and may not have an intention to limit the scope of other exemplary embodiments. It is to be understood that the singular forms include plural references unless the context clearly dictates otherwise.

All terms including technical or scientific terms used herein have the same meaning as commonly understood by those of ordinary skill in the art to which the embodiments of the present disclosure belong. It will be further understood that terms, such as those defined in commonly used dictionaries, should be interpreted as having a meaning that is identical to or similar with their meaning in the context of the relevant art and will not be interpreted in an idealized or overly formal sense unless expressly so defined herein. In some cases, the terms defined herein may be interpreted to exclude embodiments of the present disclosure.

FIG. 1 is a block diagram showing a structure of a general battery pack.

Referring to FIG. 1, a battery control system including a battery pack 1 and a upper-level controller 2 included in a upper-level system, according to an embodiment of the present disclosure is schematically shown.

As shown in FIG. 1, the battery pack 1 includes a battery module 10 that includes one or more battery cells and is chargeable/dischargeable, a switching unit 14 serially connected to a positive (+) terminal side or a negative (−) terminal side of the battery module 10 to control a charging/discharging current flow of the battery module 10, and a battery management system (BMS), e.g., a module battery management system (MBMS) 20 for control and management to prevent over-charging and over-discharging by monitoring voltage, current, temperature, etc., of the battery pack 1. The battery pack 1 may include the battery module 10, the sensor 12, the switching unit 14, and the BMS 20 provided in plural.

Herein, as the switching unit 14 which is an element for controlling a current flow for charging or discharging of the plurality of battery modules 10, for example, at least one relay, magnetic contactor, etc., may be used according to specifications of the battery pack 1.

The BMS 20, which is an interface for receiving measurement values of the above-described various parameters, may include a plurality of terminals, a circuit connected thereto to process input values, etc. Further, the BMS 20 may control the switching unit 14, for example, on/off of a relay, a contactor, etc., and may be connected to the battery module 10 to monitor a state of each battery module 10.

Meanwhile, in the BMS 20 according to the present disclosure, the degrees of aging of the battery cell and the battery module may be calculated through a separate program as described below. Further, the BMS 20 may measure the AC impedance of the battery module and the battery pack, then estimate an SOH of the battery based thereon, and diagnose whether the battery pack and the battery module are reusable. That is, the BMS 20 of FIG. 1 may correspond to the battery diagnostic apparatus 100 described below.

The upper-level controller 2 may transmit a control signal regarding the battery module 10 to the BMS 20. Thus, the BMS 20 may also be controlled in terms of an operation thereof based on a signal applied from the upper-level controller 2. Meanwhile, the battery cell according to the present disclosure may be included in the battery module used for an electric vehicle. However, the battery pack 1 of FIG. 1 is not limited to such uses, and for example, a battery rack of an ESS instead of the battery pack 1 may be included.

Such a structure of the battery pack 1 and a structure of the BMS 20 are well known, and thus a more detailed description thereof will be omitted.

Figure 2:
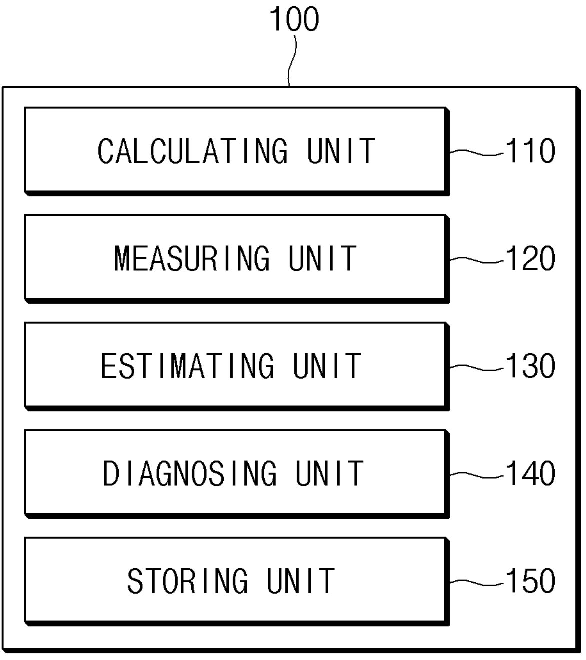
FIG. 2 is a block diagram showing a structure of a battery diagnosis apparatus, according to an embodiment of the present disclosure.

FIG. 2 is a block diagram showing a structure of a battery diagnosis apparatus, according to an embodiment of the present disclosure.

Referring to FIG. 2, a battery diagnosis apparatus 100 according to an embodiment of the present disclosure may include a calculating unit 110, a measuring unit 120, an estimation unit 130, a diagnosing unit 140, and a storing unit 150.

The calculating unit 110 may calculate the degrees of aging of a battery cell and a battery module including at least one battery cells. In addition, the calculating unit 110 may calculate deviations of the degrees of aging of the battery cell and the battery module. More specifically, the calculating unit 110 may calculate the degrees of aging based on a charging/discharging voltage during a specific cycle before removal of a battery pack. For example, the charging/discharging voltage of the battery cell may be obtained in a period when a state of charge (SOC) of the battery cell is less than 5 (e.g., out of 100) or greater than or equal to 95 (out of 100).

The measuring unit 120 may measure AC impedances of the battery cell and the battery module including the at least one battery cells. For example, the measuring unit 120 may measure the AC impedances of the battery cell and the battery module at certain intervals.

In particular, an AC impedance measured by the measuring unit 120 may be different from a measurement method based on existing electrochemical impedance spectroscopy (EIS). In other words, existing EIS measures an impedance in the unit of a battery cell, but in the battery diagnostic apparatus 100 according to an embodiment of the present disclosure, the AC impedance may be measured in the unit of a battery module or battery pack. For example, the existing EIS measurement method measures an impedance in the unit of a battery cell less than 5V, whereas the measuring unit 120 of the battery diagnosis apparatus 100 according to an embodiment of the present disclosure may perform measurement using a high-voltage AC impedance measurement method in a voltage range of about 1000V.

Such a high-voltage AC impedance measurement method measures an AC impedance trend of a total of a plurality of battery cells by directly connecting to (+)/(−) terminals of a battery module or battery pack in which the plurality of battery cells are connected and a high-voltage connector connection unit of the battery pack, rather than performing measurement by connecting a measurement device to an electrode of a battery cell as in existing EIS. This will be described in detail with reference to FIGS. 3 and 4.

The measuring unit 130 may estimate states of health (SOH) of the battery module and the battery pack based on the AC impedances of the battery module and the battery pack. At this time, the estimating unit 130 may estimate the SOH of the battery module and the battery pack based on a table, a graph, etc., regarding a correlation between previously measured AC impedances of the battery module and the battery pack and SOH. For example, data regarding a correlation between AC impedances and SOH may be stored in the storing unit 150.

The diagnosing unit 140 may diagnose a state of the battery pack based on the degree of aging of the battery cell, the degree of aging of the battery module, and the SOH of the battery pack. In this case, the diagnosing unit 140 may determine whether the battery pack is reusable, based on the degree of aging of the battery cell, the degree of aging of the battery module, and the SOH of the battery pack. The diagnosing unit 140 may also diagnose the state of the battery pack based on a deviation of at least one of the degree of aging of the battery cell and the degree of aging of the battery module.

More specifically, the diagnosing unit 140 may determine that the battery pack is reusable, when the deviation of at least one of the degree of aging of the battery cell and the degree of aging of the battery module falls within a reference range (i.e., is uniform). On the other hand, the diagnosing unit 140 may determine that the battery pack is not reusable, when the deviation of at least one of the degree of aging of the battery cell and the degree of aging of the battery module falls beyond the reference range (i.e., is nonuniform). In this case, the battery pack may be decomposed and may be reused in the unit of a module.

The diagnosing unit 140 may also diagnose the state of the battery module based on the degree of aging of the battery cell and the SOH of the battery module, when the battery pack is not reusable. In this case, the diagnosing unit 140 may determine whether the battery module is reusable, based on the degree of aging of the battery cell and the SOH of the battery module. The diagnosing unit 140 may diagnose the state of the battery module based on a deviation of the degree of aging of the battery cell.

More specifically, the diagnosing unit 140 may determine whether the battery module is reusable, based on the degree of aging of the battery cell and the SOH of the battery module. On the other hand, when the deviation of the degree of aging of the battery cell falls beyond the reference range, the diagnosing unit 140 may determine that the battery module is usable based on a battery cell having the highest degree of aging among battery cells. Therefore, the user may make a decision on various utilization methods such as using the battery module based on the most aged battery cell, extracting and using materials inside the battery cell, or the like.

The storing unit 150 may store data regarding a correlation between AC impedances and SOH of a battery module and a battery pack. Moreover, the storing unit 150 may store various data such as the degrees of aging of the battery cell and the battery module, the AC impedances and SOH of the battery module and the battery pack, etc.

However, the battery diagnosis apparatus 100 according to an embodiment of the present disclosure does not necessarily include the storing unit 150, and may be configured to store data in a database of an external server and transmit and receive the data through a communicating unit (not shown).

As such, with the battery diagnosis apparatus according to the present disclosure, by calculating a degree of aging of the battery and estimating an SOH of the battery through an AC impedance, a class of the battery may be classified within a short time, thereby quickly and easily diagnosing a state of the battery.

Figure 3:
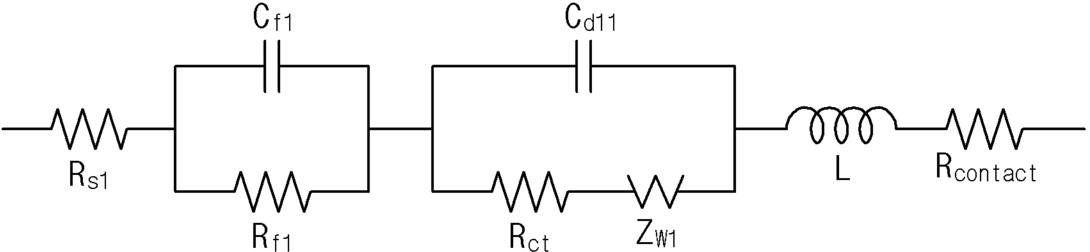
FIG. 3 is a view showing an equivalent circuit of a single battery cell.
Figure 4:
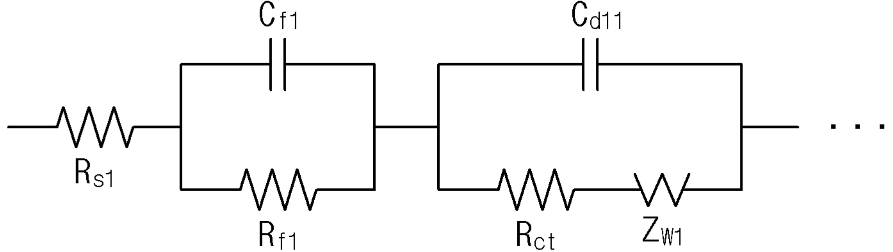
FIG. 4 is a view showing an equivalent circuit of a battery module or a battery pack.
Figure 4:
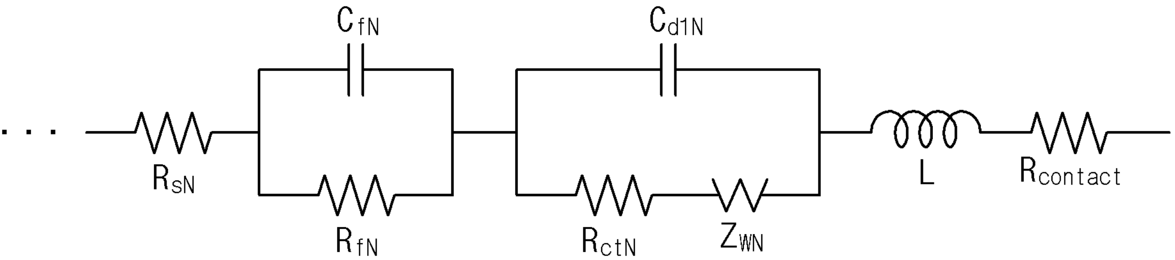

FIG. 3 is a view showing an equivalent circuit of a single battery cell, and FIG. 4 is a view showing an equivalent circuit of a battery module or a battery pack.

First, a battery diagnosis apparatus according to an embodiment of the present disclosure may apply an AC to a battery module or a battery pack in a specific frequency range (e.g., 0.1 through several Hz) and measure a voltage response for each frequency band to measure a magnitude and a phase of an impedance. Moreover, each parameter value of the battery may be extracted based on reactions of respective parameters of an equivalent circuit of a battery cell/module/pack with respect to a frequency.

In particular, a high-voltage AC impedance analysis method based on the battery diagnosis apparatus according to the present disclosure measures a battery module or a battery pack where a plurality of normal battery cells and at least one abnormal battery cells are connected, in which the type of a result value to be extracted and the number of result values may differ, due to a difference in equivalent circuit than in the existing EIS measurement method.

Thus, referring to FIG. 3, first, for an existing scheme to measure EIS of a single battery cell, a voltage range is around 20V and a frequency range is from 0.1 to 1050 Hz. In addition, an anode and a cathode may be separately measured in a three-electrode measurement manner, and an ohmic resistance may be corrected through noise cancellation.

Such a conventional measurement scheme may perform measurement in a steady state of the battery cell, i.e., in a state of chemical equilibrium and anode-potential equilibrium, and detect abnormality through absolute comparison of the battery cell with a reference value. As such, the existing cell-unit EIS measurement method should decompose the battery module or the battery pack into cell units, and has difficulty in three-electrode measurement and formation of a chemical equilibrium state, having a limitation in application to an actual product.

Referring to FIG. 3, the equivalent circuit of a single battery cell includes a first resistor Rs1, a second resistor Rf1 connected in parallel with a first capacitor Cf1, and a third resistor Rct connected in parallel with a second capacitor Cd11 and a first impedance Zw1, an inductor L, and a fourth resistor Rcontract may be connected in series.

On the other hand, in a high-voltage AC impedance measurement method according to the present disclosure using an equivalent circuit in the unit of a battery module including a plurality of battery cells or a battery pack as shown in FIG. 4, a voltage range is around 1000V and a frequency range is from 0.1 to 4000 Hz. Further, by using a two-electrode measurement scheme for a plurality of battery cells that are serially connected, repeated and reproduced measurement are possible. Moreover, with this scheme, a parasitic resistance caused by a contactor, a wire, etc., may be corrected and an influence of the parasitic resistance may be minimized by serial connection of the plurality of battery cells.

The high-voltage AC impedance measurement method used in the battery diagnosis apparatus according to an embodiment of the present disclosure may perform measurement in a state after charging and discharging of all battery modules of the same battery rack are finished at the same time, and may be capable of both relative comparison and absolute comparison for each battery module. In particular, with this scheme, an impedance value of a battery system may increase in proportion to the number of serial connections of the battery cells, N, according to the equivalent circuit shown in FIG. 4, such that when a Nyquist plot is obtained from measurement data and analysis is performed, an external influence (e.g., a sensing line inductance, a contact resistance, etc.) with respect to a measurement condition may be reduced in comparison to the single battery cell.

Referring to FIG. 4, the equivalent circuit of the battery module or battery pack includes serially connected N circuits and an inductor L and a fourth resistor Rcontract are connected in series, and N circuits each comprises a first resistor Rs1, a second resistor Rf1 connected in parallel with a first capacitor Cf1, a third resistor Rct and a first impedance Zw1 connected in parallel with the second capacitor Cd11 may be connected series.

As such, according to the high-voltage AC impedance measurement method used in the battery diagnosis apparatus according to an embodiment of the present disclosure, measurement and abnormality may be performed without decomposition into battery cell units, and the immediate reuse of the battery is possible and thus the battery may be directly applied to a battery module or rack of an ESS or a vehicle battery pack. In addition, it is not necessary to charge and discharge the battery, thereby reducing the power due to charging and discharge.

Figure 5:
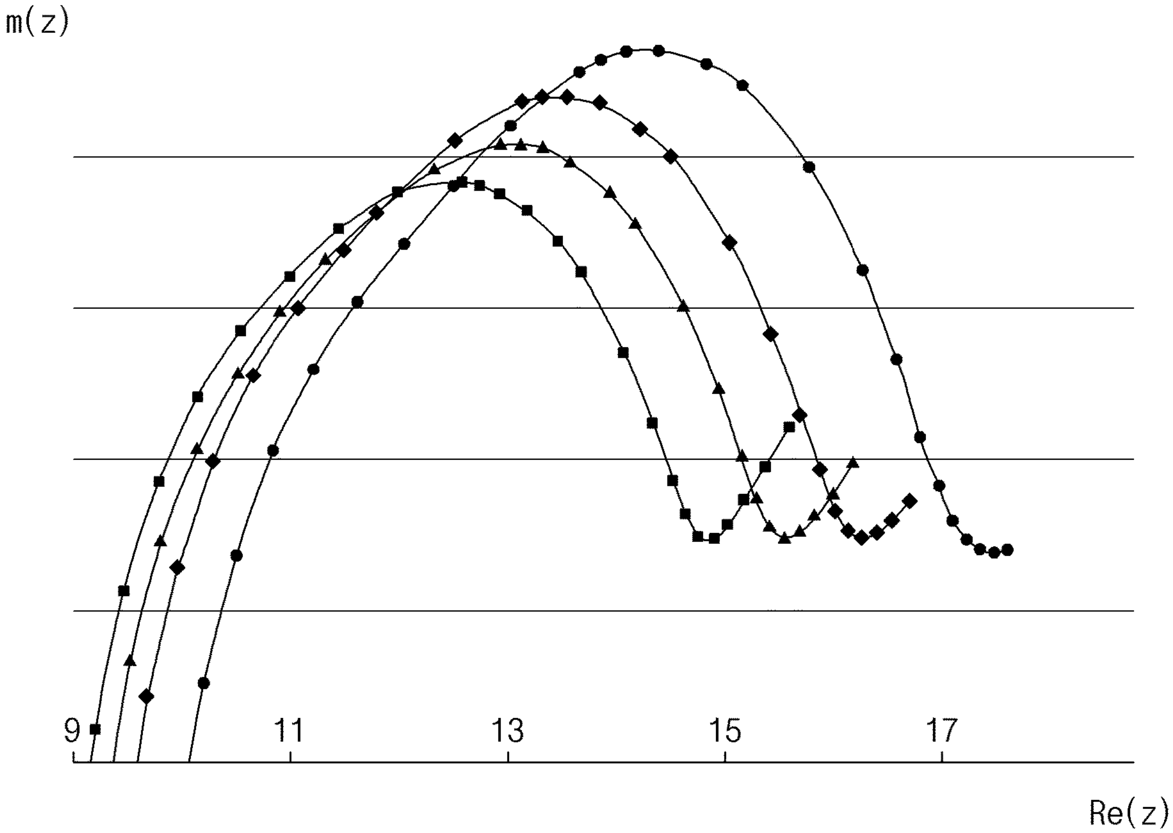
FIG. 5 is a view showing a waveform of an alternating current (AC) impedance measured by a battery diagnosis apparatus, according to an embodiment of the present disclosure.

FIG. 5 is a view showing a waveform of an AC impedance measured by a battery diagnosis apparatus, according to an embodiment of the present disclosure.

In a graph of FIG. 5, an x-axis indicates a resistance element (real(Z)) mOhm of an AC impedance, and a y-axis indicates a reactance element (imaginary(Z)) mOhm of an AC impedance.

Referring to FIG. 5, a high-voltage AC impedance value of each battery module measured by the measurement unit 120 of the battery diagnosis apparatus 100 at certain intervals is shown. In this case, it may be seen that the shape of an AC impedance waveform of the battery module differs with the battery module. Thus, in the battery diagnosis apparatus according to an embodiment of the present disclosure, the degree of aging of the battery module may be estimated in a manner like a case where a measured AC impedance of a particular battery module is greatly different from that of another battery module or deviates from a reference range set based on an AC impedance of an aged battery module established in advance in a database.

In this manner, for the battery module, which has been aged much, a remaining life may be identified through a separate charging and discharging test, and may be used as reference data in later abnormality detection of the battery module. For example, the remaining life of a replaced battery module and the measured AC impedance value may be matched and stored in the form of a table in the storing unit 150, thus being used as reference data in later abnormality diagnosis for the battery module. Meanwhile, when the aged battery module is replaced, the reusable battery may be used to replace the battery at an affordable price and the system may be stably operated by adjusting the degree of aging of the entire battery system of the ESS.

Figure 6:
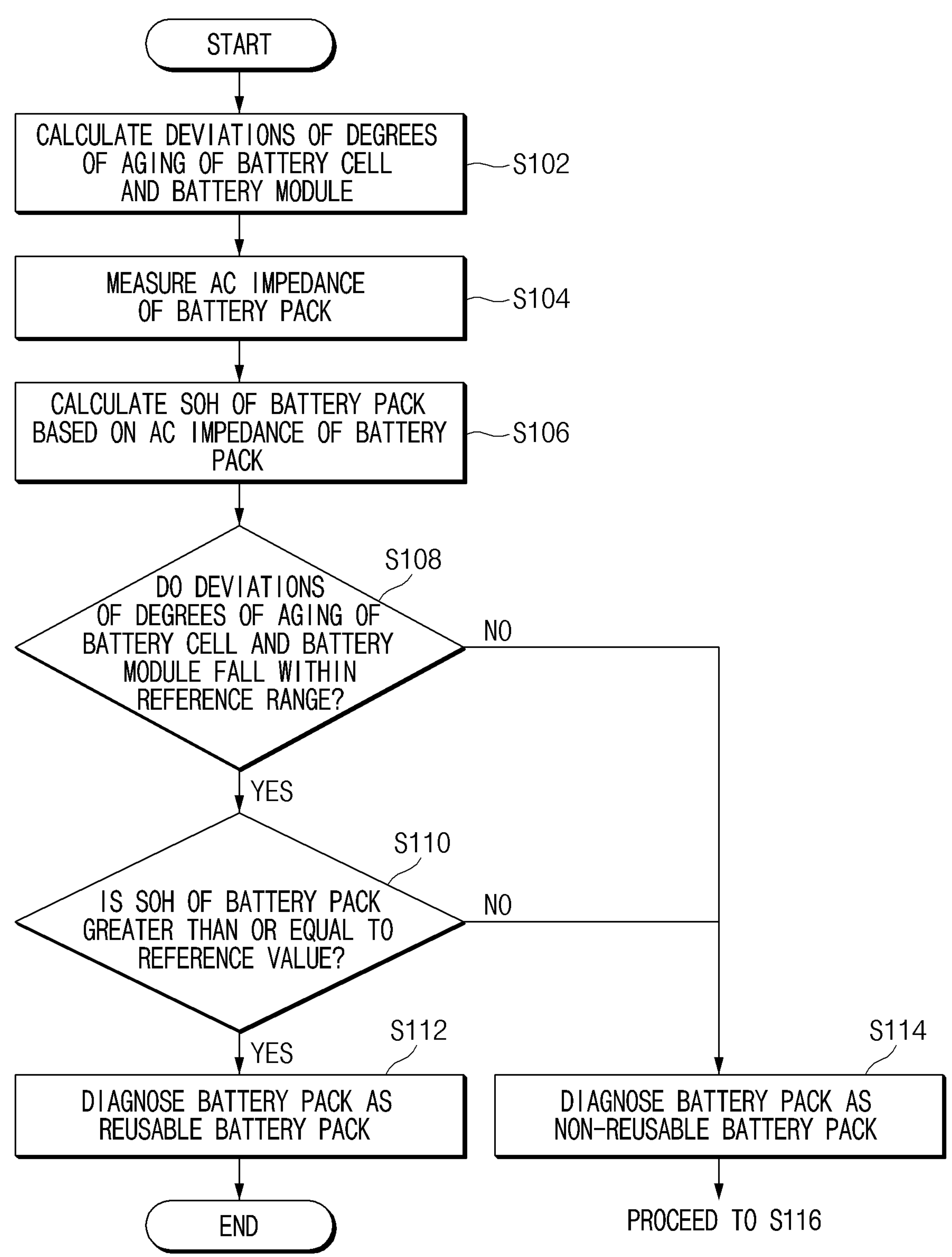
FIGS. 6 and 7 are flowcharts showing a battery diagnosis method according to an embodiment of the present disclosure.
Figure 7:
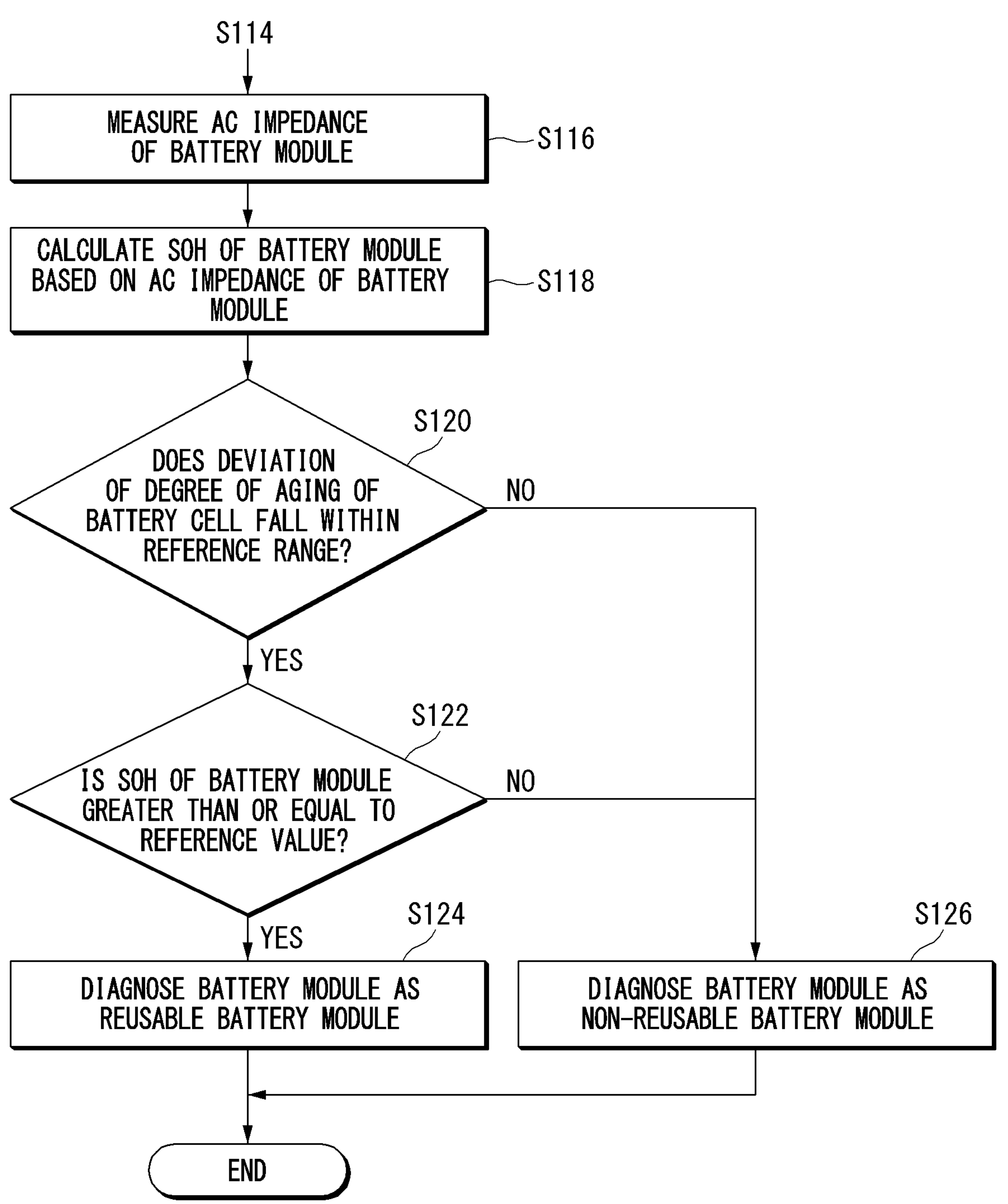

FIGS. 6 and 7 are flowcharts showing a battery diagnosis method according to an embodiment of the present disclosure.

Referring to FIG. 6, a battery diagnosis method according to an embodiment of the present disclosure may calculate deviations of degrees of aging of a battery cell and a battery module, in operation S102. More specifically, in operation S102, the degree of aging may be calculated based on a charging/discharging voltage during a specific cycle before removal of a battery pack. For example, as the charging/discharging voltage of the battery cell, a voltage in a period where the SOC of the battery cell is less than 5 or is greater than or equal to 95 may be obtained.

An AC impedance of the battery pack may be measured in operation S104. For example, in operation S104, the AC impedance of the battery pack may be measured at certain intervals. In addition, the SOH of the battery pack may be calculated based on the AC impedance of the battery pack, in operation S106. At this time, in operation S106, the SOH of the battery pack may be estimated based on a table, a graph, etc., regarding a correlation between a previously measured AC impedance of the battery pack and SOH. For example, data regarding a correlation between an AC impedance and SOH may be stored in the storing unit 150 of FIG. 1.

Next, in operation S108, it is determined whether the deviations of the degrees of aging of the battery cell and the battery module fall within a reference range. When the deviations of the degrees of aging of the battery cell and the battery module fall within the reference range (i.e., is uniform) (YES), it is determined whether the SOH of the battery pack is greater than or equal to a reference value, in operation S110. When the SOH of the battery pack is greater than or equal to the reference value (YES), the battery pack is diagnosed as a reusable battery pack, in operation S112.

On the other hand, when the deviations of the degrees of aging of the battery cell and the battery module do not fall within the reference range or the SOH of the battery pack is less than the reference value, the battery pack is diagnosed as a non-reusable battery pack, in operation S114. In this case, the battery pack may be decomposed and may be reused in the unit of a module.

Next, in FIG. 7, a case where the battery pack is diagnosed as the non-reusable battery pack in operation S114 is assumed. Referring to FIG. 7, first, the AC impedance of the battery module may be measured, in operation S116. In addition, the SOH of the battery module may be calculated based on the AC impedance of the battery module, in operation S118.

Next, in operation S120, it is determined whether the deviation of the degree of aging of the battery cell falls within the reference range. When the deviation of the degree of aging of the battery cell falls within the reference range (i.e., is uniform) (YES), it is determined whether the SOH of the battery module is greater than or equal to the reference value, in operation S122. When the SOH of the battery module is greater than or equal to the reference value (YES), the battery module is diagnosed as a reusable battery module, in operation S124.

On the other hand, when the deviation of the degree of aging of the battery cell does not fall within the reference range or the SOH of the battery pack is less than the reference value, the battery pack is diagnosed as a non-reusable battery pack, in operation S126. In this case, the battery module is usable based on the battery cell having the highest degree of aging among the battery cells. Therefore, the user may make a decision on various utilization methods such as using the battery module based on the most aged battery cell, extracting and using materials inside the battery cell, or the like.

As such, with the battery diagnosis method according to the present disclosure, by calculating a degree of aging of the battery and estimating an SOH of the battery through an AC impedance, a class of the battery may be classified within a short time, thereby quickly and easily diagnosing a state of the battery.

Figure 8:
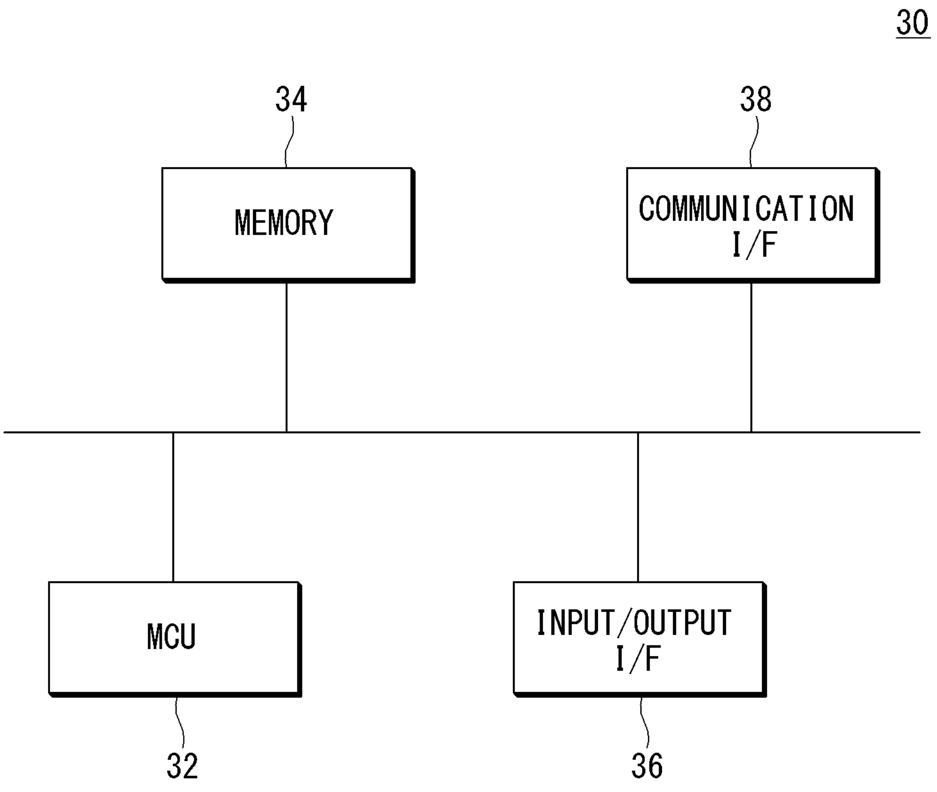
FIG. 8 is a view showing a hardware structure of a computing system for operating a battery abnormality detection apparatus according to an embodiment of the present disclosure.

FIG. 8 is a view showing a hardware structure of a computing system for operating a battery abnormality detection apparatus, according to an embodiment of the present disclosure.

Referring to FIG. 8, a computing system 30 according to an embodiment of the present disclosure may include a micro controller unit (MCU) 32, a memory 34, an input/output interface (I/F) 36, and a communication I/F 38.

The MCU 32 may be a processor that executes various programs (e.g., a battery aging degree calculation program, an SOH calculation program, a battery diagnosis program, etc.) stored in the memory 34, processes various data including the degrees of aging of the battery cell and the battery module, AC impedances of the battery module and the battery pack, SOH, etc., through these programs, and executes functions of the battery diagnosis apparatus shown in FIG. 2.

The memory 34 may store various programs regarding calculation of the degree of aging of the battery and calculation of the SOH and battery diagnosis. The memory 34 may store various data such as the degree of aging of the battery, the AC impedance, SOH data, etc.

The memory 34 may be provided in plural, depending on a need. The memory 34 may be a volatile or nonvolatile memory. For the memory 34 as the volatile memory, random access memory (RAM), dynamic RAM (DRAM), static RAM (SRAM), etc., may be used. For the memory 34 as the nonvolatile memory, read only memory (ROM), programmable ROM (PROM), electrically alterable ROM (EAROM), erasable PROM (EPROM), electrically erasable PROM (EEPROM), flash memory, etc., may be used. The above-listed examples of the memory 34 are merely examples and are not limited thereto.

The input/output I/F 36 may provide an interface for transmitting and receiving data by connecting an input device (not shown) such as a keyboard, a mouse, a touch panel, etc., and an output device such as a display (not shown), etc., with the MCU 32.

The communication I/F 38, which is a component capable of transmitting and receiving various data to and from a server, may be various types of devices capable of supporting wired or wireless communication. For example, a program for SOH calculation of the battery and state diagnosis of the battery or various data, etc., may be transmitted and received to and from a separately provided external server through the communication I/F 38.

As such, a computer program according to an embodiment of the present disclosure may be recorded in the memory 34 and processed by the MCU 32, thus being implemented as a module that performs functions shown in FIG. 2.

Even though all components constituting an embodiment of the present disclosure have been described above as being combined into one or operating in combination, the present disclosure are not necessarily limited to the embodiment. That is, within the object scope of the present disclosure, all the components may operate by being selectively combined into one or more.

Moreover, terms such as "include", "constitute" or "have" described above may mean that the corresponding component may be inherent unless otherwise stated, and thus should be construed as further including other components rather than excluding other components. All terms including technical or scientific terms have the same meanings as those generally understood by those of ordinary skill in the art to which the present disclosure pertains, unless defined otherwise. The terms used generally like terms defined in dictionaries should be interpreted as having meanings that are the same as the contextual meanings of the relevant technology and should not be interpreted as having ideal or excessively formal meanings unless they are clearly defined in the present disclosure.

The above description is merely illustrative of the technical idea of the present disclosure, and various modifications and variations will be possible without departing from the essential characteristics of the present disclosure by those of ordinary skill in the art to which the present disclosure pertains. Therefore, the embodiments disclosed in the present disclosure are intended for description rather than limitation of the technical spirit of the present disclosure and the scope of the technical spirit of the present disclosure is not limited by these embodiments. The protection scope of the technical spirit of the present disclosure should be interpreted by the following claims, and all technical spirits within the same range should be understood to be included in the range of the present disclosure.

The invention claimed is:

1. A battery diagnosis apparatus comprising:

a calculator configured to calculate degrees of aging of a battery cell and a battery module comprising the battery cell, based on a charging or discharging voltage during a specific cycle;

a measurer configured to measure an alternating current (AC) impedance of a battery pack comprising the battery module;

an estimator configured to estimate a state of health (SOH) of the battery pack based on the AC impedance of the battery pack; and a diagnoser configured to diagnose a state of the battery pack, based on the degree of aging of the battery cell, the degree of aging of the battery module, and the SOH of the battery pack, the diagnoser being configured to determine that the battery pack is reusable, when a deviation of at least one of the degree of aging of the battery cell and the degree of aging of the battery module falls within a reference range, wherein when the deviation falls within the reference range, the SOH of the battery pack is greater than or equal to a reference value, wherein, based on the diagnosed state of the battery pack by the diagnoser, a battery management system is configured to control an on and off of a switch that controls charging and/or discharging of the battery pack, and wherein the charging or discharging voltage during the specific cycle is obtained in a period when a state of charge (SOC) of the battery cell is less than a first value or greater than or equal to a second value different from the first value.

2. The battery diagnosis apparatus of claim 1, wherein the diagnoser is configured to:

diagnose the state of the battery pack, based on the deviation of at least one of the degree of aging of the battery cell and the degree of aging of the battery module.

3. The battery diagnosis apparatus of claim 1, wherein the measurer is configured to measure an AC impedance of the battery module, the estimator is configured to estimate a SOH of the battery module based on the AC impedance of the battery module, and the diagnoser is configured to diagnose a state of the battery module based on the degree of aging of the battery cell and the SOH of the battery module.

4. The battery diagnosis apparatus of claim 3, wherein the diagnoser is configured to:

determine whether the battery module is reusable, based on the degree of aging of the battery cell and the SOH of the battery module.

5. The battery diagnosis apparatus of claim 3, wherein the diagnoser is configured to:

determine that the battery module is reusable, when the deviation of the degree of aging of the battery cell falls within the reference range.

6. The battery diagnosis apparatus of claim 3, wherein the battery module includes a plurality of battery cells, and wherein the diagnoser is configured to determine that the battery module is usable based on a battery cell having a highest degree of aging among the battery cells, when the deviation of the degree of aging of the battery cell falls beyond the reference range.

7. The battery diagnosis apparatus of claim 1, wherein the estimator is configured to estimate the SOH of the battery pack based on a correlation between a previously measured AC impedance of the battery pack and a previously measured SOH of the battery pack.

8. A battery diagnosis apparatus comprising:

a calculator configured to calculate a degree of aging of a battery cell based on a charging or discharging voltage during a specific cycle;

a measurer configured to measure an alternating current (AC) impedance of a battery module comprising the battery cell;

an estimator configured to estimate a state of health (SOH) of the battery module based on the AC impedance of the battery module; and a diagnoser configured to diagnose a state of a battery pack including the battery module, based on the degree of aging of the battery cell and the SOH of the battery module, the diagnoser being configured to determine that the battery pack is reusable, when a deviation of the degree of aging of the battery cell falls within a reference range, wherein when the deviation falls within the reference range, a SOH of the battery pack is greater than or equal to a reference value, wherein, based on the diagnosed state of the battery pack by the diagnoser, a battery management system is configured to control an on and off of a switch that controls charging and/or discharging of the battery pack, and wherein the charging or discharging voltage during the specific cycle is obtained in a period when a state of charge (SOC) of the battery cell is less than a first value or greater than or equal to a second value different from the first value.

9. The battery diagnosis apparatus of claim 8, wherein the diagnoser is configured to:

determine whether the battery module is reusable, based on the degree of aging of the battery cell and the SOH of the battery module.

10. The battery diagnosis apparatus of claim 8, wherein the diagnoser is configured to:

determine that the battery module is reusable, when the deviation of the degree of aging of the battery cell falls within the reference range.

11. The battery diagnosis apparatus of claim 8, wherein the battery module includes a plurality of battery cells, and wherein the diagnoser is configured to determine that the battery module is usable based on a battery cell having a highest degree of aging among the battery cells, when the deviation of the degree of aging of the battery cell falls beyond the reference range.

12. The battery diagnosis apparatus of claim 8, wherein the calculator is configured to calculate a degree of aging of the battery module, the measurer is configured to measure an AC impedance of the battery pack comprising the battery module, the estimator is configured to estimate the SOH of the battery pack based on the AC impedance of the battery pack, and the diagnoser is configured to determine the state of the battery pack, based on the degree of aging of the battery cell, the degree of aging of the battery module, and the SOH of the battery pack.

13. The battery diagnosis apparatus of claim 12, wherein the diagnoser is configured to:

determine whether the battery pack is reusable, based on the degree of aging of the battery cell, the degree of aging of the battery module, and the SOH of the battery pack.

14. The battery diagnosis apparatus of claim 12, wherein the diagnoser is configured to:

diagnose whether the battery pack is reusable based on at least one of the deviation of the degree of aging of the battery cell and a deviation of the degree of aging of the battery module.

15. The battery diagnosis apparatus of claim 12, wherein the diagnoser is configured to:

determine that the battery pack is reusable, when at least one of the deviation of the degree of aging of the battery cell and a deviation of the degree of aging of the battery module falls within the reference range.

16. A battery diagnosis method comprising:

calculating degrees of aging of a battery cell and a battery module comprising the battery cell, based on a charging or discharging voltage during a specific cycle;

measuring an alternating current (AC) impedance of a battery pack comprising the battery module;

estimating a state of health (SOH) of the battery pack based on the AC impedance of the battery pack;

diagnosing a state of the battery pack, based on the degree of aging of the battery cell, the degree of aging of the battery module, and the SOH of the battery pack, the diagnosing the state of the battery pack including determining that the battery pack is reusable, when a deviation of at least one of the degree of aging of the battery cell and the degree of aging of the battery module falls within a reference range, wherein when the deviation falls within the reference range, the SOH of the battery pack is greater than or equal to a reference value; and controlling, by a battery management system, an on and off of a switch that controls charging and/or discharging of the battery pack based on the diagnosed state of the battery pack, wherein the charging or discharging voltage during the specific cycle is obtained in a period when a state of charge (SOC) of the battery cell is less than a first value or greater than or equal to a second value different from the first value.

17. The battery diagnosis method of claim 16, further comprising:

measuring an AC impedance of the battery module;

estimating an SOH of the battery module based on the AC impedance of the battery module; and diagnosing the state of the battery pack further based on the SOH of the battery module.

* * * * *